United States Patent [19]

Kryze

[11] Patent Number: 4,570,183
[45] Date of Patent: Feb. 11, 1986

[54] METHOD AND APPARATUS FOR MEASURING PULSES OF CHARGE

[75] Inventor: Georges Kryze, Pontchartrain, France

[73] Assignee: Inria Institut National de Recherche en Informatique et Automatique, Les Chesnay, France

[21] Appl. No.: 539,915

[22] Filed: Oct. 7, 1983

[30] Foreign Application Priority Data

Nov. 15, 1982 [FR] France ................... 82 19097

[51] Int. Cl.$^4$ ............ H04N 5/14; H03F 1/34
[52] U.S. Cl. ....................... 358/184; 330/9
[58] Field of Search ........... 358/212, 184, 213, 209; 330/9, 69, 149, 51

[56] References Cited

U.S. PATENT DOCUMENTS

| | | | |
|---|---|---|---|
| 3,590,153 | 6/1971 | Minowa | 178/7.1 |
| 4,081,793 | 3/1978 | Lohstroh | 340/166 R |
| 4,298,843 | 11/1981 | Nixon | 330/9 |
| 4,323,798 | 4/1982 | Watkins | 307/491 |
| 4,453,130 | 6/1984 | Bennett | 330/51 |
| 4,486,783 | 12/1984 | Tanaka et al. | 358/213 |

FOREIGN PATENT DOCUMENTS 0022323 1/1981 European Pat. Off. ............ 358/213
2434397 3/1980 France.

OTHER PUBLICATIONS

Understanding IC Operational Amplifiers, Melen et al., Howard W. Sams & Co., 1971, p. 10.

Primary Examiner—Gene Z. Rubinson
Assistant Examiner—Stephen Brinich
Attorney, Agent, or Firm—Karl F. Ross; Herbert Dubno

[57] ABSTRACT

The present invention relates to a method and to apparatus for measuring electric charge, in particular for measuring small electric charges which are present in rapid succession, as happens under the effect of radiation, ionizing particles, or from piezo-electric means.

The apparatus comprises an amplifier (2) having high input impedance and a feedback network. The feedback network comprises at least one branch (24) connecting the output (6) of the amplifier (2) to an inverting input (21) thereof. Three switches (3,4,5) are so connected that either one of two of them (3,4) is capable of interrupting the transmission of an electrical signal via said at least one branch (24) of the feedback circuit. The portion of said branch (24) located between said switches includes electrical energy storing means ($C_2$).

16 Claims, 8 Drawing Figures

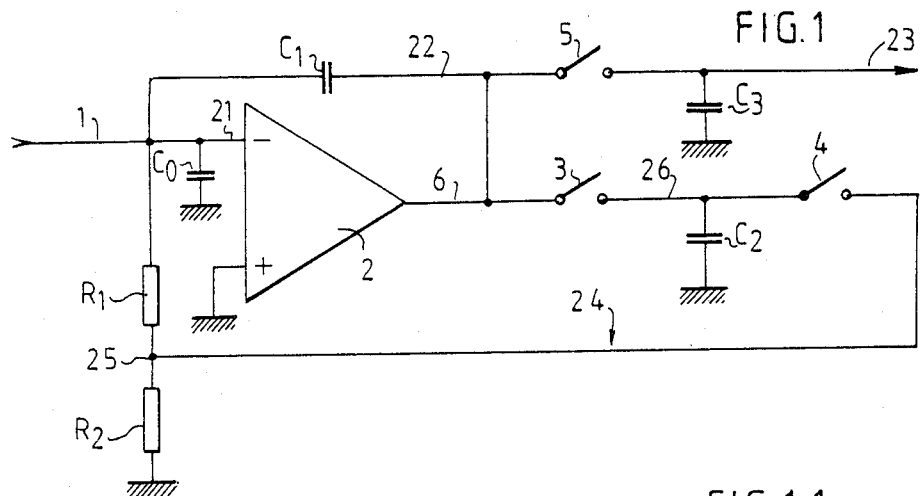
FIG. 1
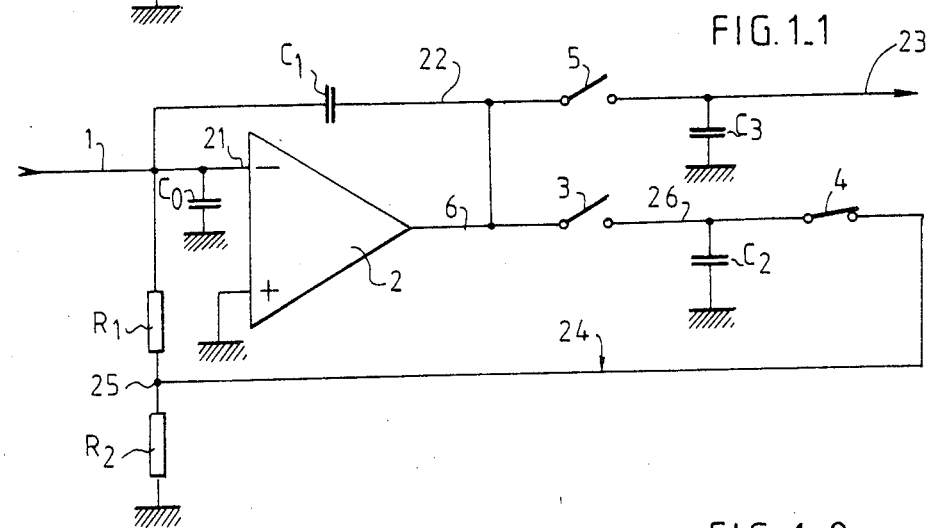
FIG. 1_1
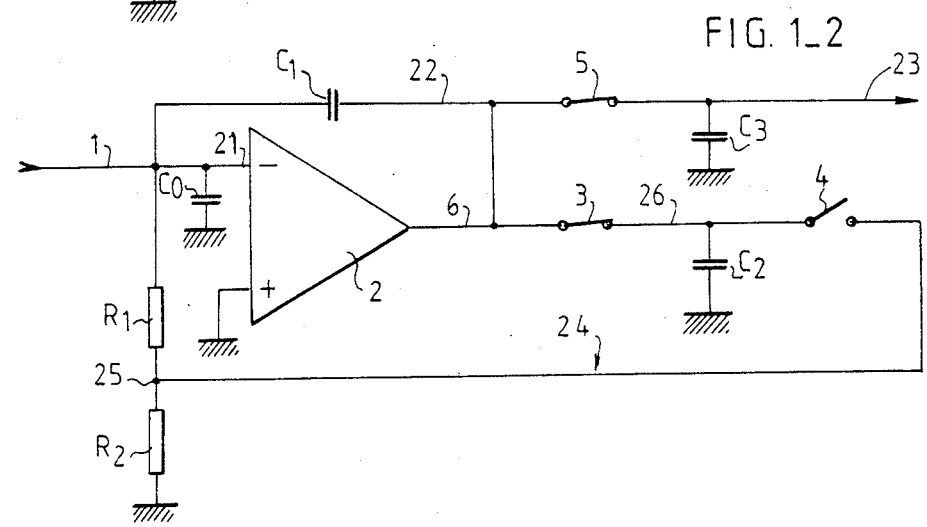
FIG. 1_2

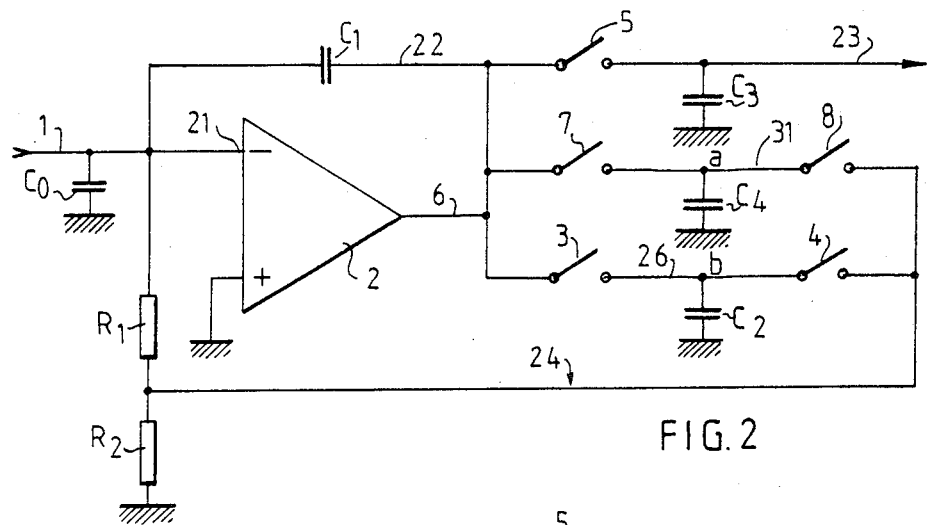
FIG. 2
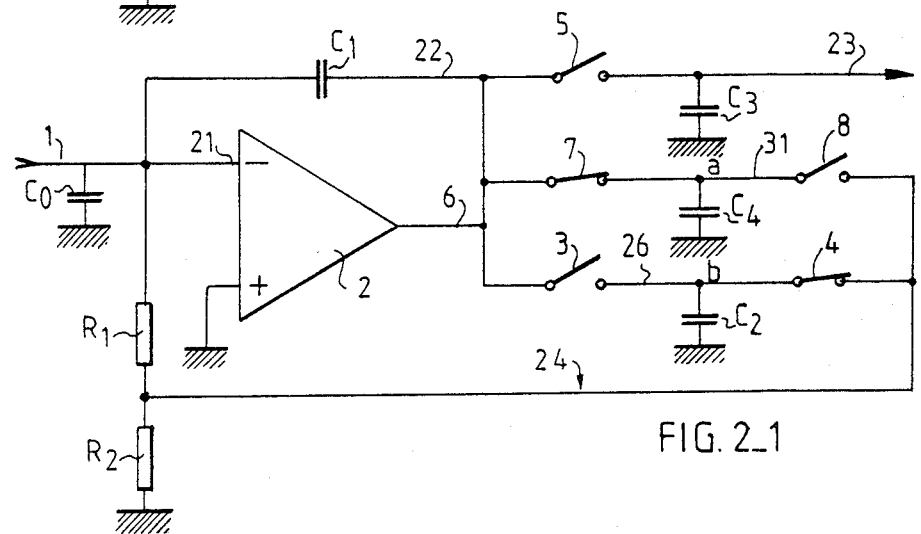
FIG. 2_1
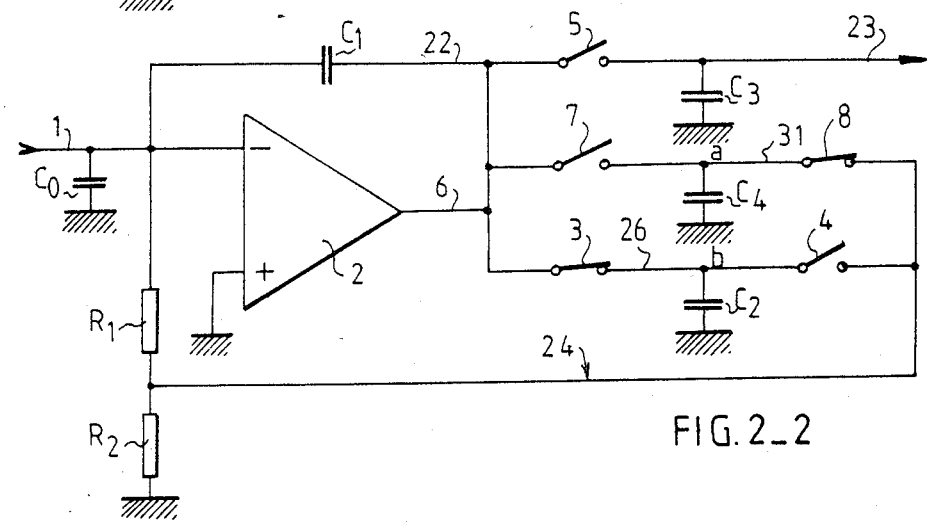
FIG. 2_2

4,570,183

METHOD AND APPARATUS FOR MEASURING PULSES OF CHARGE

FIELD OF THE INVENTION

The present invention relates to a method and to apparatus for sensing or detecting electric charge, in particular for sensing or detecting small electric charges which are present in rapid succession, as happens under the effect of radiation, ionizing particles, of from piezoelectric means.

BACKGROUND OF THE INVENTION

Conventionally, an electric charge is not measured directly, but rather from the electric potential which is developed across a known capacitance by the said charge or by a determined fraction thereof.

Such a measuring technique is difficult to adapt to sensing or detecting a rapid succession of electric charges, eg. the charges supplied by a cellular sensor such as an array of photodiodes where each cell supplies its charge in turn, by means such as charge transfer, transistor switching, electron beam scanning, etc.

Up to the present, as accurate a measurment capacitor as can be obtained has been charged either with the total charge to the measured or with a known fraction thereof, and then, after measuring the corresponding electric voltage, the capacitor has been discharged as completely as possible to make it ready to receive the next charge or fraction thereof for measurement.

The measurement capacitance is usually constituted either by the output capacitance of the set of sensors and/or by the input capacitance of the measuring circuit, or else by the integrating capacitance of an electronic integrator.

In either case, alternating between charging and discharging the capacitance is a limiting factor on the rate at which measurements can be peformed.

Further, if the integration method is used, it is necessary to discharge the integrating capacitance by applying a short circuit across its terminals, thereby greatly altering the parameters of the integrator feedback loop and thus compromising its stability. If an attempt is made to remedy this point, the set up time must be increased, thereby further reducing the maximum rate at which measurments can be made.

SUMMARY OF THE INVENTION

The present invention replaces the step of discharging the capacitance before each measurement with a step of subtracting the previously measured charge therefrom.

The subtraction can take place simultaneously with the measurement, for which purpose, the invention advantageously includes means for memorizing each measured charge until the next measurement takes place.

The electronic integrator feedback loop can then be constituted solely of passive components together with at least two switches (eg. field effect transistors or FETs).

In which case, the charge measuring circuit may include only one operational amplifier, namely the amplifier used in the integrator.

Since the dominant variable in the feedback loop is effectively the electric charge to be measured rather than a current, a voltage, or time, the loop operates independently of the rate at which measurements are made, and thus the rate can vary in random manner from one measurement to the next.

In operation, there is negligible variation in the gain of the feedback loop and the parameters of the loop can therefore be optimized to obtain a very short charge setting up time.

Operation is insensitive to factors such as temperature, frequency, gain variations, etc.

BRIEF DESCRIPTION OF THE DRAWING

Embodiments of the invention are described by way of example with reference to the accompanying drawing, in which:

FIG. 1 is a circuit diagram of a first embodiment of the invention;

FIG. 1-1 shows the same circuit as FIG. 1, but with its switches in a first operative configuration;

FIG. 1-2 shows the same circuit as FIG. 1, but with its switches in a second operative configuration;

FIG. 2 is a circuit diagram of a second embodiment of the invention;

FIG. 2-1 shows the same circuit as FIG. 2, but with its switches in a first operative configuration;

FIG. 2-2 shows the same circuit as FIG. 2, but with its switches in a second operative configuration;

SPECIFIC DESCRIPTION

Figure 3:
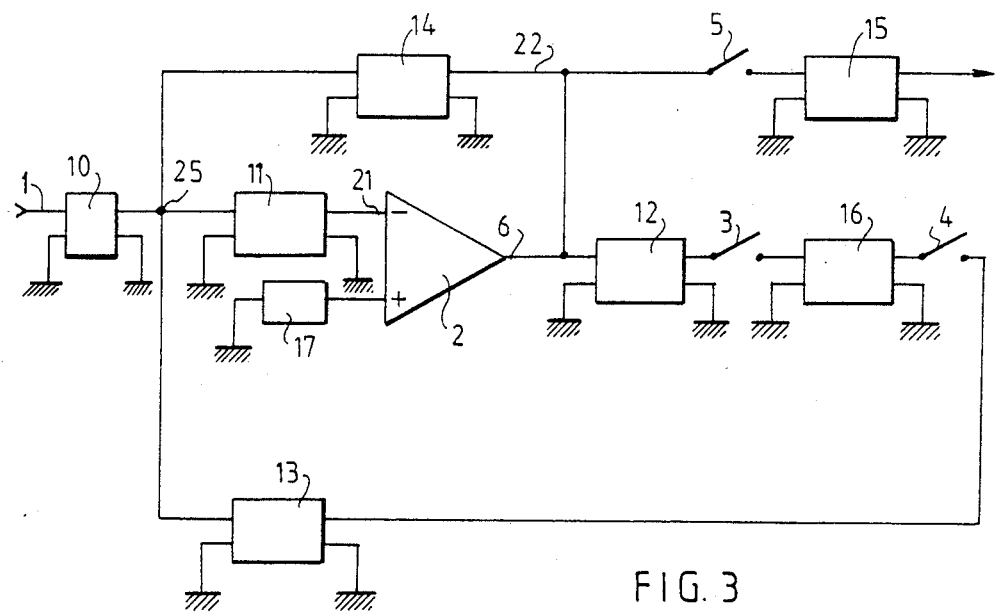
FIG. 3 is a block diagram of a circuit which is a variant of the FIG. 1 circuit.

FIG. 1 is a circuit diagram of a first embodiment of apparatus for sensing or detecting (and amplifying) electric charges in accordance with the invention. The circuit has an input 1 connected to the inverting input 21 of an operational amplifier 2 whose gain is taken to be substantially infinite. The amplifier 2 has a two-branch feedback loop comprising an integrating branch 22 (AC feedback) and a take-off branch 24 (DC feedback) connected in parallel between the amplifier output 6 and its inverting input 21. The integrating branch 22 is constituted by a series-connected integrating capacitor $C_1$. The take-off branch 24 comprises first and second switches 3 and 4 connected in series between the amplifier output 6 and a common point 25 between two resistors $R_1$ and $R_2$ which are themselves connected in series between ground and the inverting input 21. The portion 26 of the branch 24 lying between the series-connected switches 3 and 4 is connected to ground by a pulse feedback capacitor $C_2$. The output 6 of the operational amplifier 2 is also connected to the output 23 of the measuring apparatus via a circuit which includes a third switch 5 connected in series between the amplifier output 6 and the apparatus output 23, and a memorizing capacitor $C_3$ connected between the apparatus output 23 and ground. When the third switch 5 is closed, it connects one terminal of the integrating capacitor $C_1$ to the ungrounded terminal of the memorizing capacitor $C_3$. The output capacitance of the sensor plus the input capacitance of the apparatus is symbolized by a capacitor $C_0$ connecting the inverting input 21 of the operational amplifier 2 to ground.

In a first configuration (see FIG. 1-1), the first and third switches 3 and 5 are open while the second switch 4 is closed. The initial charges on the capacitors are nil. When an electric charge $Q_i$ arrives at the input 1, which in accordance with the well-known behavior of electronic integrator circuits constitutes a virtual ground, said charge is transferred to the integrating capacitor $C_1$.

Once the entire charge $Q_i$ has arrived on the capacitor $C_1$, the voltage $U_i$ at the output 6 of the integrator is:

$$U_i = -Q_i/C_1 \quad (1)$$

In a second configuration (see FIG. 1-2), the first and third switches 3 and 5 are closed and the second switch 4 is open. The voltage $U_i$ is thus transferred to the memorizing capacitor $C_3$ and to the pulse feedback capacitor $C_2$. The input charge $Q_i$ remains on the integrating capacitor $C_1$.

The pulse feedback capacitor $C_2$ then stores an electric charge $Q_{2i}$ whose value is:

$$Q_{2i} = -Q_i \cdot \frac{C_2}{C_1} \quad (2)$$

The circuit then returns to the first configuration shown in FIG. 1-1, with the first and third switches 3 and 5 open and the second switch 4 closed.

The voltage on the memorizing capacitor $C_3$ thus remains equal to $U_i$ and constitutes the measured value of the charge $Q_i$. The memorizing capacitor $C_3$ thus serves to store output readings from the measurement apparatus and may be used by further devices connected to the output 23, eg. amplifiers, converters, etc.

The pulse feedback capacitor $C_2$ discharges through the resistors $R_2$ and $R_1$, with the charge thereon being divided in the ratio of their resistances.

The fraction of the charge which returns to the amplifier input 21 constitutes a feedback pulse, and is equal to:

$$Q_{2i} \cdot \frac{R_2}{R_1 + R_2} \quad (3)$$

which, taking equation (2) into account, is equal to:

$$-Q_i \cdot \frac{C_2 R_2}{C_1(R_1 + R_2)} \quad (4)$$

This charge is added to the charge already present on the integrating capacitor $C_1$, giving a resultant charge of:

$$-Q_i \cdot \left(1 - \frac{C_2 R_2}{C_1(R_1 + R_2)}\right) \quad (5)$$

The values of $C_1$, $C_2$, $R_1$, and $R_2$ are chosen to satisfy:

$$\frac{C_2 R_2}{C_1(R_1 + R_2)} = 1 \quad (6)$$

Using such values, the charge from the pulse feedback capacitor $C_2$ is equal and opposite to the charge on the integrating capacitor $C_1$, thereby completely cancelling it.

As soon as the apparatus has returned to the configuration of FIG. 1-1, ie. before the pulse from the capacitor $C_2$ has been fully fed back, it is permissible to admit a new charge to the input 1 for measurement, ie. a charge $Q_{i+1}$. In other words, the feedback pulse may be applied to the integrator simultaneously with a new pulse of charge to be measured, so long as the FIG. 1-1 configuration lasts long enough for both charge pulses to be completely transferred to the integrating capacitor $C_1$. Once both charge pulses have been completely transferred, the charge on the integrating capacitor $C_1$ is again equal to the input charge and is unaffected by the preceding charge $Q_i$.

Advantageously the resistors $R_1$ and $R_2$ are chosen to have the same temperature coefficient, as are the capacitors $C_1$ and $C_2$. These four components are further selected to be stable over time.

Current technology provides components satisfying these conditions with high accuracy and at modest price.

Equation (6) on which operation is based makes no allowance for time. This means that the operation of the circuit is insensitive to the lengths of time the switches are retained in either of their configurations, provided only that they remain in each configuration long enough to damp the transient conditions set up by either switch-over.

A further requirement is that the first and second switches 3 and 4 should not be closed simultaneously.

The effect of the capacitor $C_0$, ie. principally of the output capacitance of the sensor and the input capacitance of the operational amplifier is also negligible. The instability that such capacitances might have caused can be ignored.

Reference is now made to FIG. 2 which is a circuit diagram for a second embodiment of the invention. The second embodiment is similar to the first, but the take-off branch 24 of the feedback circuit includes not only the branch 26, but also a further branch 31 connected in parallel thereto. The branch 31 likewise comprises a pair of series-connected switches (fourth and fifth) 7 and 8 and a second pulse feedback capacitor $C_4$ connected between ground and the point common to the switches 7 and 8.

In a first configuration (FIG. 2-1), the first and fifth switches 3 and 8 are open while the second and fourth switches 4 and 7 are closed. The third switch 5 is open. When a charge $Q_i$ arrives at the input 1, the charge on the capacitor $C_2$ from the preceding stage is subtracted therefrom, in the same manner as described above with reference to the FIG. 1 embodiment. The effect of the preceding measured charge is thus eliminated, and the new charge $Q_i$ is measured independently of earlier measurements.

In a second configuration (FIG. 2-2), the first and fifth switches 3 and 8 are closed and the second and fourth switches 4 and 7 are open. The third switch 5 is again open. A charge $Q_{i+1}$ arrives at the input 1, and as in the preceding configuration, the charge on the appropriate pulse feedback capacitor ($C_4$ in this case) is subtracted therefrom, thereby eliminating the influence of the previous charge $Q_i$ from the measurement of the new charge $Q_{i+1}$.

As in the FIG. 1 embodiment, the resistances $R_1$ and $R_2$ and the capacitance $C_2$ must satisfy the relationship:

$$\frac{C_2 R_2}{C_1(R_1 + R_2)} = 1 \quad (7)$$

In addition, the following relationship must also be satisfied:

$$C_2 = C_4 \qquad (8)$$

The third switch 5 is closed for a short period of time just before each change over between the first and second configurations.

In this FIG. 2 embodiment, an electric charge is measured for each switch over, thereby doubling the maximum rate at which measurements can be made compared to the FIG. 1 embodiment, while using an amplifier 1 of identical quality.

In both of the above embodiments, the third switch 5 and the memorizing capacitor $C_3$ serve to sample and hold voltages representative of the charges being measured.

In a variant, the output 6 of the operational amplifier 2 may be directly connected to the input of downstream equipment, eg. another amplifier, an analog to digital converter, a differentiator, etc.

Embodiments of the invention can also be devised that take into account transient effects, the stability characteristics of the integrator, and the presence of various parasitic distributed capacitances, inductances and resistances.

Such embodiments comprise generalized impedances or two port networks in place of the simple resistances and capacitances described so far.

An example of such an embodiment is shown in FIG. 3. This embodiment has the same general organization as the FIG. 1 embodiment. The capacitor $C_0$ of FIG. 1 which represented the output capacitance of the sensor circuit plus the input capacitance of the operational amplifier is replaced in the FIG. 3 embodiment by first and second two port networks 10 and 11. The first network 10 is connected between the input to the apparatus and the common point 25 between the two branches of the feedback loop while the second network 11 is connected between the common point 25 and the input 21 to the operational amplifier 2. The integrating capacitance $C_1$ in the branch 22 of the feedback loop in FIG. 1 has been replaced by a two port network 14, and the memorizing capacitance $C_3$ for sampling and holding the output reading has been replaced by a two port network 15. The pulse feedback capacitance $C_2$ of FIG. 1 has been replaced by two port network 16 disposed between the first and second switches 3 and 4. Another two port network 12 is inserted in the circuit between the output 6 of the amplifier 6 and the first switch 3. The potentiometer constituted by the resistances $R_1$ and $R_2$ of FIG. 1 has been replaced by a generalized two port network 13. The non-inverting input to the amplifier 2 is connected to ground via a generalized impedance 17.

Transformers and/or non-linear devices and/or active devices may be included in any of said generalized impedances or networks.

In one embodiment, the potentiometer function performed by the resistances $R_1$ and $R_2$ of the FIG. 1 embodiment, namely taking a desired fraction of the charge contained on the pulse feedback capacitance $C_2$, is performed instead of a transformer to which diodes and/or other devices may also be connected.

Similar modifications may also be applied to the FIG. 2 embodiment.

Advantageously, the circuits shown in FIGS. 1 to 3 may include adjustable components such as variable resistors or variable capacitors to enable each component to be adjusted to the exact value required for proper operation of the apparatus as a whole.

In a variant, the integrator or operational amplifier is dispensed with and is replaced by an amplifier of finite voltage gain equal to A. The integrating capacitance $C_1$ is then also dispensed with together with the resistance $R_2$. Charge is accumulated on the capacitance $C_0$ which is usually constituted by the output capacitance of the sensor that supplies the charge plus by the input capacitance of the voltage gain amplifier, together with an optional extra capacitor connected in parallel.

The equation for charge cancelling then becomes:

$$(A-1) \cdot C_2 = C_0 \qquad (9)$$

The measurement voltage at the output then becomes:

$$U_i = \frac{A \cdot Q_i}{C_0 + C_2} \qquad (10)$$

The same procedure can be applied to the FIG. 2 embodiment.

Extra switches may be added to improve separation, or to modify operation. For example, each of the switches described so far as being a single switch may, in fact, be constituted by two switching devices connected in series, thereby reducing leakage currents to negligible proportions.

Similarly, a pair of switches such as the switches 3 and 4 or 7 and 8 could be replaced by a reversing switch.

Preferred switches for use with the invention are FETs, but in certain special cases bipolar transistors, or contacts which are optically, or magnetically, or electromechanically controlled may be used instead.

The invention also covers apparatus for measuring differences between charges, said apparatus making use of the charge measuring apparatus described above with reference to FIGS. 1 to 3.

Such a differentiator applies the following observation, namely that the total electric charge passing through the capacitor in any given time interval is determined by the difference in the voltages across the capacitor at the beginning and end instants of said interval.

Figure 4:
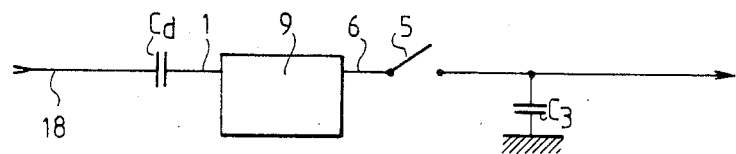
FIG. 4 is a diagram of a differentiator including the circuit of any of FIGS. 1, 2 or 3.

In the embodiment shown in FIG. 4, the reference 9 designates an apparatus such as those described above with reference to FIGS. 1 to 3. The apparatus 9 has the same input 1, and its output 6 is taken from the point 6 in said apparatuses. The output sample and hold circuit comprising the third switch 5 and the memorizing capacitor $C_3$ are shown in FIG. 4.

The voltage at the input 18 to the differentiator is $û_i$. It is conveyed to the input 1 of the circuit 9 via a differentiating capacitor $C_d$.

The charge $Q_i$ measured between two sampling instants of the output from the integrating circuit 9 is given by:

$$Q_2 = (u_i - u_{i-1})C_d \qquad (11)$$

where $û_i$ and $û_{i-1}$ are the voltage values at the input 18 at said sampling instants, which are also instants when the switches inside the circuit 9 are changed over.

At the same sampling instants, the voltages at the output 6 of the circuit 9 are given by:

$$U_i = -(u_i - u_{i-1}) \frac{C_d}{C_1} \qquad (12)$$

which is proportional to the difference between the voltages $\hat{u}_i$.

The absence of a time factor in these equations for the voltage to be measured, gives rise to a differentiator which is remarkably stable in operation.

In one embodiment, small resistances are connected in series with the differentiating capacitance $C_d$ for the purpose of controlling its discharge and to keep stable the operational amplifier which forms a part of the differentiator.

The amplifiers used in the various embodiments described above all have very high input impedance, eg. they are operational amplifiers that use FET input stages.

The circuits described with reference to FIGS. 1 to 4 can be made to operate with values of $C_1$, $C_2$, $R_1$ and $R_2$ which do not satisfy equation (6).

Setting the left hand side of equation (6) to be equal to a, as follows:

$$\frac{C_2 R_2}{C_1(R_1 + R_2)} = a \qquad (13)$$

the operation of the circuit will be governed by the difference equation:

$$U_i + (a-1)U_{i-1} = Q_i/C_1 \qquad (14)$$

whose solution:

$$U_i = -\frac{1}{C_1} \sum_{k=0}^{\infty} Q_{i-k}(1-a)^k \qquad (15)$$

shows the $U_i$ depends on all the preceding values.

Thus, putting $a < 1$ it is possible to achieve a degree of smoothing, while putting $a > 1$ serves to emphasize transitions in the sequence of $Q_i$.

Apparatus in accordance with the invention is advantageously applicable to TV cameras and the like using linear or array matrices of photodiodes which communicate their charge either by switching means or by transfer means. The rate at which assemblies of photodiodes can be read is thereby considerably increased, and at the same time the equipment benefits from high stability and excellent sample separation.

I claim:

1. An amplifying and pulse sensing circuit for electric charge, the circuit comprising an amplifier having high input impedance and a feedback network, the improvement wherein the feedback network comprises at least one branch connecting the output of the amplifier to an inverting input thereof via at least two switches which are connected in series, either of which is capable of interrupting the transmission of an electrical signal via said at least one branch of the feedback circuit, and wherein the portion of said branch of the feedback circuit located between said switches includes electrical energy storing means, said switches being controlled in alternating manner such that each is closed for a substantial portion of the time that the other is open, with simultaneous closing being avoided, and with short periods of simultaneous opening being permitted, said feedback network including a plurality of parallel-connected branches, each comprising a respective pair of said series-connected switches on either side of respective energy storing means, and wherein said alternating control is applied to all such branches.

2. A circuit according to claim 1, wherein said feedback network includes two substantially identical parallel-connected branches each comprising a respective pair of said series-connected switches on either side of respective energy storing means, said switches being controlled in alternation and in phase opposition in such a manner that, in operation, the output from the amplifier is connected to one or other of the energy storing means for substantially all the time, while the inverting input of the amplifier is connected for substantially all of the time to the energy storing means which is not connected to the output.

3. A circuit according to claim 1, wherein said energy storing means comprise a capacitor.

4. A circuit according to claim 1, wherein said amplifier with high input impedance is a very high gain operational amplifier including an essentially capacitive feedback branch suitable for performing an integration function.

5. A circuit according to claim 1, including a two port network connected between the, or each, energy storing means and the inverting input to the amplifier to deliver a predetermined function or fraction of the energy stored in said means to said input, said two port network comprising components selected from resistors, capacitors, inductors, and transformers.

6. A circuit according to claim 1, further comprising an essentially capacitative component connected in series between a voltage to be differentiated and an input to said amplifier.

7. A circuit as defined in claim 1, further comprising an assembly of photodiodes having a charge signal generated by each photodiode by sensed radiation connected to said amplifier.

8. A method of sensing pulses of charge, the method comprising applying a pulse of charge to be sensed to a capacitance thereby obtaining across said capacitance a voltage which is proportional to the charge to be sensed, storing a signal representative of said voltage on means other than said capacitance, deriving a pulse of charge from said stored signal, said derived pulse of charge being opposite in sign and substantially equal in magnitude to the measured pulse of charge, and applying both said derived pulse of charge and a next pulse of charge to be measured to said capacitance, whereby the resulting voltage appearing across said capacitance is proportional to said next pulse of charge to be sensed.

9. A circuit for amplifying and sensing pulses of electrical charge, comprising:

an input terminal adapted to receive successive pulses of electrical charge;

a high input impedance amplifier having an inverting input coupled to said input terminal to form an integrating amplifier arrangement therewith, and having an output;

a capacitative feedback path provided between said amplifier output and said inverting input;

at least one branch circuit connected to the amplifier output, and comprising, in series, a first switch means, a coupling to a charge storing member, and a second switch means, said charge storing member being otherwise coupled to a reference voltage, for storing charge with respect thereto;

means in series with said second switch means and capable, upon closure of said second switch means, of coupling a predetermined portion of the charge stored within said charge storing member to said inverting input of the amplifier;

said amplifier thereby having a DC negative feedback path exclusively formed by said at least one branch and said means in series therewith;

said second and first switch means being closed one at a time upon receipt of a pulse of charge on said input terminal, and said predetermined portion being selected such that the charge recirculated through said DC negative feedback path during said closure of the second switch means compensates for the corresponding input pulse of charge having existed until said closure of the second switch means.

10. A circuit according to claim 9, wherein said DC negative feedback path comprises two branches in parallel between the said amplifier output and the same said means in series, the first and second switch means of the first branch being closed in opposition with those of the second branch.

11. A circuit according to claim 9 wherein said amplifier is a very high gain operational amplifier having a noninverting input connected to said reference voltage.

12. The circuit defined in claim 9 wherein said reference voltage is ground.

13. A circuit according to claim 11 wherein said reference voltage is ground.

14. A circuit according to claim 9 wherein said means in series comprises a two-part network selected from resistors, capacitors, inductors and transformers.

15. A circuit according to claim 9 wherein said input terminal has an essentially incapacitive parallel impedance behavior.

16. A circuit according to claim 9 wherein said charge storage member comprises a combination of positive and negative elements.

* * * * *